(12) United States Patent
Lewison et al.

(10) Patent No.: US 11,158,562 B2
(45) Date of Patent: Oct. 26, 2021

(54) CONFORMAL INTEGRATED CIRCUIT (IC) DEVICE PACKAGE LID

(71) Applicant: International Business Machines Corporation, Armonk, NY (US)

(72) Inventors: David J. Lewison, LaGrangeville, NY (US); Hongqing Zhang, Hopewell Junction, NY (US); Jay A. Bunt, Esopus, NY (US); Jeffrey A. Zitz, Poughkeepsie, NY (US); Sushumna Iruvanti, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/787,241

(22) Filed: Feb. 11, 2020

(65) Prior Publication Data

US 2021/0249333 A1     Aug. 12, 2021

(51) Int. Cl.
*H01L 23/40* (2006.01)
*H05K 7/20* (2006.01)
*F28F 13/00* (2006.01)
*H01L 23/427* (2006.01)

(52) U.S. Cl.
CPC ............ *H01L 23/40* (2013.01); *F28F 13/003* (2013.01); *H01L 23/427* (2013.01); *H05K 7/20* (2013.01)

(58) Field of Classification Search
None
See application file for complete search history.

(56) References Cited

U.S. PATENT DOCUMENTS

| 4,092,697 | A |   | 5/1978  | Spaight |
|-----------|---|---|---------|---------|
| 4,686,606 | A |   | 8/1987  | Yamada et al. |
| 4,854,377 | A | * | 8/1989  | Komoto .............. H01L 23/433 165/80.4 |
| 5,000,256 | A |   | 3/1991  | Tousignant |
| 5,006,924 | A |   | 4/1991  | Frankeny et al. |
| 5,323,292 | A |   | 6/1994  | Brzezinski |
| 6,054,198 | A |   | 4/2000  | Bunyan et al. |
| 6,665,186 | B1|   | 12/2003 | Calmidi et al. |
| 7,007,741 | B2|   | 3/2006  | Sen et al. |

(Continued)

OTHER PUBLICATIONS

Hassan et al. (IBM), "Chip Cooling Employing a Conformable Alloy", IP.com No. IPCOM000048982D, Feb. 9, 2005. (Original Publication Date: Apr. 1, 1982. Original Disclosure Information: IBM TDB Apr. 1982 pp. 5595-5597).

(Continued)

*Primary Examiner* — Courtney L Smith
(74) *Attorney, Agent, or Firm* — ZIP Group PLLC (57) ABSTRACT

An integrated circuit (IC) device package includes an IC device connected to an upper surface of the IC device carrier. Due to operation conditions or IC device package makeup, the IC device may warp. The warped IC device may include a convex upper surface. A conformable lid is connected to the IC device and includes an internal chamber and a deformable floor. The deformable floor is able to deform or bend along with the IC device. After deformation, the deformable floor may include a concave lower surface. A uniform bond line thickness of a thermal interface material that connects the IC device and the conformable lid is able to be achieved due to the deformable floor deforming or bending along with the IC device.

19 Claims, 9 Drawing Sheets

(56) References Cited

U.S. PATENT DOCUMENTS

| | | | |
|---|---|---|---|
| 7,348,665 B2* | 3/2008 | Sauciuc | H01L 23/42 |
| | | | 257/714 |
| 8,156,998 B2 | 4/2012 | Furman | |
| 9,743,558 B2 | 8/2017 | Bosak et al. | |
| 10,643,924 B1* | 5/2020 | Shen | H01L 23/3675 |
| 10,770,372 B2* | 9/2020 | Gutala | H01L 23/367 |
| 2003/0207064 A1 | 11/2003 | Bunyan et al. | |
| 2004/0074630 A1* | 4/2004 | Sen | H01L 23/473 |
| | | | 165/46 |
| 2006/0158849 A1 | 7/2006 | Martin et al. | |
| 2007/0216035 A1* | 9/2007 | Kurita | H01L 21/563 |
| | | | 257/778 |
| 2008/0137300 A1* | 6/2008 | Macris | H01L 24/32 |
| | | | 361/699 |
| 2008/0225484 A1* | 9/2008 | Brodsky | H01L 23/42 |
| | | | 361/699 |
| 2010/0200197 A1 | 8/2010 | Bezama et al. | |
| 2019/0267332 A1* | 8/2019 | Sikka | H01L 21/4846 |
| 2020/0100396 A1* | 3/2020 | Iyengar | G06F 1/20 |

OTHER PUBLICATIONS

Kang et al. (IBM), "Thermal Sponge", IP.com No. IPCOM000039093D, Feb. 1, 2005. (Original Publication Date: Apr. 1, 1987; Original Disclosure Information: IBM TDB Apr. 1987 pp. 4950-4951).

\* cited by examiner

CONFORMAL INTEGRATED CIRCUIT (IC) DEVICE PACKAGE LID

FIELD OF THE EMBODIMENTS

Embodiments of the present invention generally relate to integrated circuit (IC) device packages, and more particularly to an IC device package that includes a lid that conforms to topographic fluctuation, warpage, or curvature of an associated IC device surface.

DESCRIPTION OF THE RELATED ART

IC devices are generally becoming more powerful and there is a need for improved efficiency in removing heat therefrom. High-performance paste, gel, adhesive, soft solid metal, or the like, called Thermal Interface Material (TIM) is commonly used in the semiconductor industry to assist in cooling high-power IC devices. It serves to bridge or fill a gap between the IC device and a cooling plate which results in a more efficient heat transfer path between the IC device and a cooling plate.

However, polymeric TIM's are fairly poor in thermal conductivity, as compared to most metals. Therefore, to minimize the detrimental impact of the lower thermal conductivity, the TIM layer, also known as the bond line thickness (BLT), should be kept as thin as possible.

Modern IC devices mounted to packaging carriers, interposers, and/or laminates often exhibit warpage due to coefficient of thermal expansion (CTE) mismatches that occur between the various components of the IC device package and/or due to power/thermal cycling of the IC device. This IC warpage makes it difficult to control, minimize, and achieve a uniform TIM BLT in order to achieve the most optimal thermal performance.

SUMMARY

In an embodiment of the present invention, an electronic device is presented. The electronic device includes an IC device carrier and an IC device connected to the upper surface of the IC device carrier. The IC device includes a convex upper surface. The electronic device further includes a conformable lid that includes an internal chamber, an internal chamber inlet, and a deformable floor. The deformable floor includes a concave lower surface. The electronic device further includes a thermal interface material (TIM) that connects the convex upper surface and the concave lower surface. The TIM includes a uniform bond line thickness. The electronic device further includes a heatsink that is connected to an upper surface of the conformable lid. The internal chamber inlet of the conformable lid extends through a base of the heatsink.

In another embodiment of the present invention, a method of achieving a uniform bond line thickness of a thermal interface material (TIM) between an integrated circuit (IC) device and a conformable lid is presented. The method includes allowing the deformable floor of the conformable lid to bend around a warped IC device. The bent deformable floor includes a concave lower surface and the TIM connects a convex upper surface of the warped IC device and the concave lower surface and comprises a uniform bond line thickness.

In another embodiment of the present invention, a fabrication method is presented. The method includes connecting an integrated circuit (IC) device package to a motherboard. The method includes connecting a heatsink to the upper surface of a conformable lid of the IC device package such that an inlet to an internal chamber of the conformable lid extends through a clearance hole within the heatsink. The method further includes injecting liquid metal into the internal chamber through the inlet.

These and other embodiments, features, aspects, and advantages will become better understood with reference to the following description, appended claims, and accompanying drawings.

BRIEF DESCRIPTION OF THE FIGURES

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

An integrated circuit (IC) device package includes an IC device connected to an upper surface of the IC device carrier. Due to operation conditions or IC device package makeup, the IC device may warp. The warped IC device may include a convex upper surface. A conformable lid is connected to the IC device and includes an internal chamber and a deformable floor. The deformable floor is able to deform or bend along with the IC device. After deformation, the deformable floor may include a concave lower surface. A uniform bond line thickness of a thermal interface material that connects the IC device and the conformable lid is able to be achieved due to the deformable floor deforming or bending along with the IC device.

Figure 1:
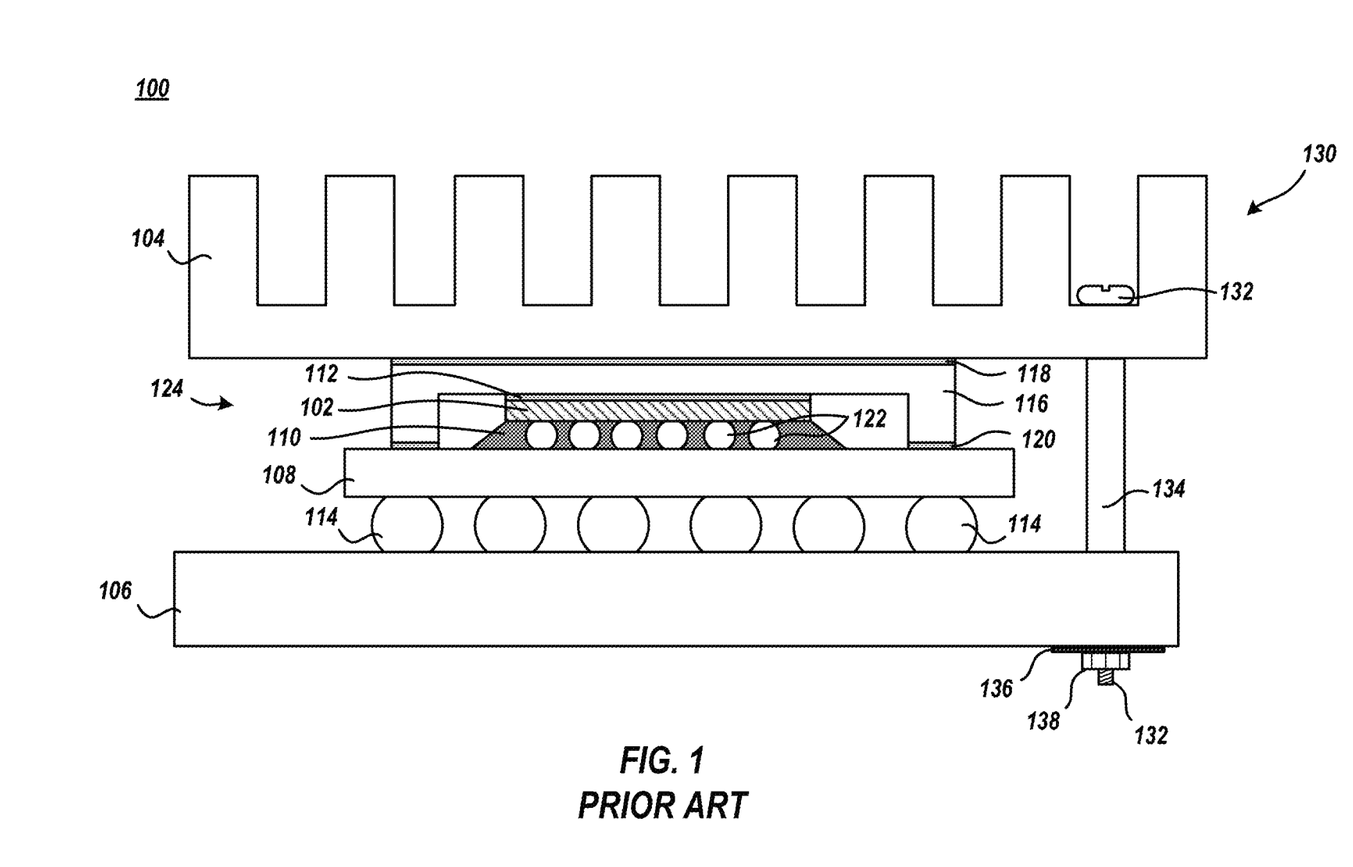
FIG. 1 depicts a prior art electronic system.

FIG. 1 depicts a prior art electronic system 100. Electronic system 100 may be for example a computer, server, etc. System 100 includes an IC chip module or package 124 that includes an IC device 102 that may be referred herein as chip 102, carrier 108, interconnects 122, underfill 110, thermal interface material 112, lid 116, and adhesive 120.

Chip 102 may be an IC chip, semiconductor die, processor, microchip, field programmable gate array, or the like. Carrier 108 may be an organic carrier or a ceramic carrier and provides mechanical support for chip 102 and electrical paths from the upper surface of carrier 108 to the opposing side of carrier 108. Interconnects 122 electrically connect chip 102 and the upper side of carrier 108 and may be a wire bond, solder bond, stud, conductive ball, conductive button, or the like. Underfill 110 may be electrically-insulating, may substantially surround interconnects 122, may isolate individual interconnects 122, and may provide mechanical support between chip 102 and carrier 108. Underfill 110 may also assist in preventing damage to individual interconnects 122 due to CTE mismatches between chip 102 and carrier 108.

When chip 102 is seated upon carrier 108, a reflow process may be performed to join interconnects 122 to electrical contacts of both chip 122 and carrier 108. After chip 102 is seated to carrier 108, a lid 116 is attached to carrier 108 with adhesive 120. Generally, during operation of electronic device 100, heat needs to be removed from chip 102. In this situation, lid 116 is both a lid and a conduit for heat transfer. As such, a thermal interface material 112 may thermally join lid 116 and chip 102.

Package 124 may be connected to a motherboard 106 via interconnects 114. Motherboard 106 may be the main printed circuit board of electronic device 100 and may include electronic components, such as a graphics processing unit, memory, hard drive storage, and the like, and may further provide connectors for other peripherals. Interconnects 114 electrically connect the lower side of carrier 108 to motherboard 106 and may be a wire bond, solder bond, stud, conductive ball, conductive button, land grid array (LGA) of compliant pins, and the like. Interconnects 114 may be larger and thus more robust than interconnects 122. When package 124 is seated upon motherboard 106 a second reflow process may be performed to join interconnects 114 to electrical contacts of both carrier 108 and motherboard 106. Alternately, a mechanical pressurized interconnect via an intervening socket may be established.

To assist in the removal of heat from chip 102 a heatsink 104 may be thermally joined to package 124 via thermal interface material 118. Heatsink 104 is a passive heat exchanger that cools chip 102 by dissipating heat into the surrounding air. As such, during operation of electronic device 100, a thermal path may exist from chip 102 to heatsink 104 through thermal interface material 112, lid 116, and thermal interface material 118, and the like. Heatsink 104 may be connected to motherboard 106 via one or more connection device 130. Connection device 130 may include a threaded fastener 132, standoff 134, backside stiffener 136, and fastener 138. Threaded fastener 132 may extend through heatsink 104, standoff 134, and backside stiffener 136 and provides compressive force between heatsink 104 and backside stiffener 136. The length of standoff 134 may be selected to limit the pressure exerted upon package 124 by heatsink 104 created by the compressive forces. Backside stiffener 136 may mechanically support the compressive forces by distributing the forces across a larger area of motherboard 104. In other applications, connection device 130 may be a clamp, non-influencing fastener, cam, and the like, system that adequately forces heatsink 104 upon package 124.

Figure 2:
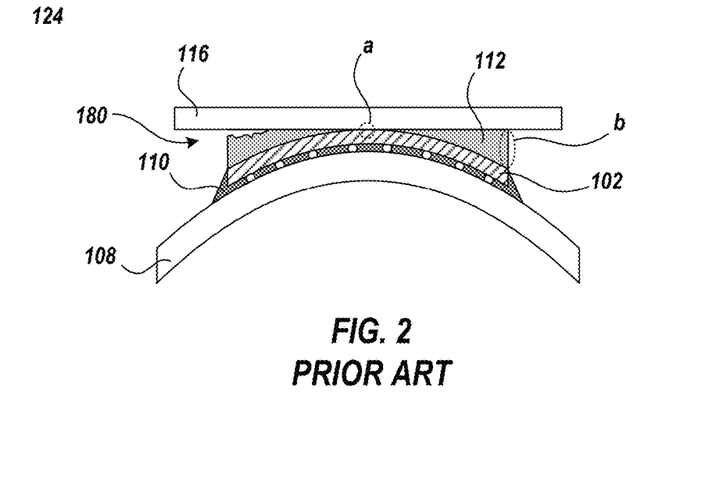
FIG. 2 depicts a prior art IC device package.

FIG. 2 depicts a prior art IC device package 124. During normal operating conditions, chip 102 may exhibit warpage or other non-flat surface abnormalities. For example, due to CTE differences between lid 116, chip 102, and carrier 108, the lid 116, chip 102, and carrier 108 may expand at a different rate or to relatively different dimensions as a result of powering or heating chip 102. These differences may cause the chip 102 and/or the carrier 108 to warp whilst the lid 116 stays relatively flat, as depicted. Lid 116 may stay mostly flat due to the harder, stiffer, thicker, etc. material from which it is fabricated relative to the materials of the chip 102 and/or the materials of the carrier 108 which may warp or exhibit other non-flat surface abnormalities.

TIM 112 bridges or fills the gap between the upper surface of chip 102 and the bottom surface of lid 116. Heat transfer efficiently between the chip 102 and the lid 116 is a function of the thickness of TIM 112. Due to the warpage of chip 102, the TIM 112 is thicker on the edges or corners of chip 102 and thinner in the center or vertex of chip 102. In other words, due to the warpage, dimension "b" of TIM 112 is larger relative to dimension "a" of TIM 116. Such relative difference in TIM BLT results in inefficient heat transfer from the chip 102 to the lid 116. In some instances, due to the warpage, TIM 112 may tear way from either the chip 102 and/or lid 116, further limiting heat transfer from the chip 102 to the lid 116. When chip 102 and/or carrier 108 does exhibit warpage or other non-flat surface abnormalities, it may be most common for chip 102 and/or carrier 108 to exhibit concave curvature(s) of respective lower surfaces and convex curvature(s) of respective upper surfaces, as depicted.

Figure 3:
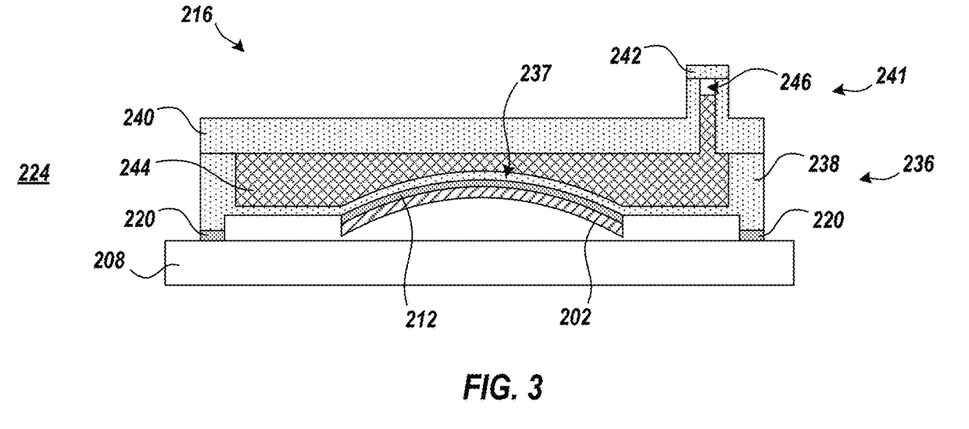
FIG. 3 depicts a cross section view of an IC device package that includes a conformal lid, according to one or more embodiments of the present invention.
Figure 4:
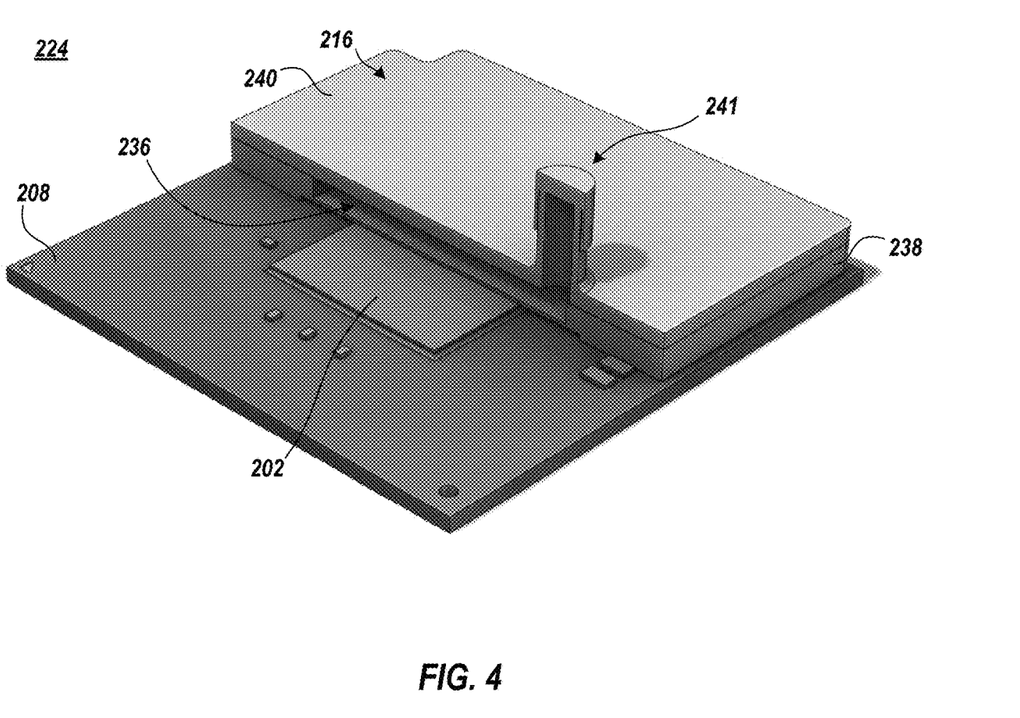
FIG. 4 depicts an isometric partial cutaway view of an IC device package that includes a conformal lid, according to one or more embodiments of the present invention.

FIG. 3 depicts a cross section view and FIG. 4 depicts an isometric partial cutaway view of an IC device package 224 that includes a conformal lid 216, according to one or more embodiments of the present invention. Referring to both FIG. 3 and FIG. 4, IC chip module or package 124 includes an IC device 202, carrier 208, interconnects 222 (depicted in, e.g., FIG. 6), underfill 210 (depicted in, e.g., FIG. 6), thermal interface material 212, and conformal lid 216.

IC device 202 may be an IC chip, semiconductor die, processor, microchip, field programmable gate array, or the like. Carrier 208 may be an organic carrier or a ceramic carrier and provides mechanical support for IC device 202 and electrical paths from the upper surface of carrier 208 to the bottom surface of carrier 208. Interconnects 222 electrically connect IC device 202 and the upper side of carrier 208 and may be a wire bond, solder bond, stud, conductive ball, conductive button, or the like. Underfill 210 may be electrically-insulating, may substantially surround interconnects 222, may isolate individual interconnects 222, and may provide mechanical support between IC device 202 and carrier 208. Underfill 210 may also assist in preventing damage to individual interconnects 222 due to CTE mismatches between IC device 202 and carrier 208.

When IC device 202 is seated upon carrier 108, a reflow process may be performed to join interconnects 222 to electrical contacts of both IC device 202 and carrier 208. After IC device 202 is seated to carrier 208, conformal lid 216 is attached to the IC device 202 by TIM 212 and is attached to carrier 208 by seal band 220. Generally, during operation of electronic device 300, shown in, e.g., FIG. 9, which includes package 224, heat needs to be removed from IC device 202. Conformal lid 216 is, therefore, both a lid and a conduit for heat transfer.

Conformal lid 216 includes at least a thin deformable floor 237. Conformal lid 216 may further include lower portion 238, upper portion 240, internal chamber 236, inlet 241, inlet cap 242, and/or liquid metal 244.

Deformable floor 237 may be a part of the lower portion 238 and may be formed of a metal such as copper, or the like. The upper surface of deformable floor 237 may form the lower boundary of internal chamber 236. The lower surface of deformable floor 237 may be configured to attach to the IC device 202 with TIM 212. In other words, TIM 212 may fill the gap between the upper surface of IC device 202 and the lower surface of deformable floor 237.

The thickness of deformable floor 237 is sufficiently thin such that deformable floor 237 deforms or bends when subjected to forces applied thereto by TIM 212 and/or IC device 202 when IC device 202 warps or exhibits non-flat surface abnormalities. In this manner, the deformable floor 237 conforms to the warpage or non-flat surfaces of IC device 202 when such abnormalities occur. The thickness of deformable floor 237 may further be sufficiently thick such that deformable floor 237 does not deform or bend when subjected to forces applied thereto when conformal lid 216 is seated or otherwise attached to IC device 202.

Lower portion 238 may be formed of a metal such as copper, or the like, and may further include a front wall, rear wall, left wall, and right wall. The inside surfaces of such walls may form the side boundaries of internal chamber 236. Lower portion 238 may further include a pedestal around the perimeter circumference of the lower surface of the lower portion 238. The pedestal may provide adequate clearance between the IC device 202, contacts 222, or the like and the upper surface of carrier 208. The lower surface of pedestal (when present) may be connected to carrier 208 by seal band 220.

Upper portion 240 may be formed of a metal such as copper, or the like, and includes a lower surface and upper surface. The lower surface of upper portion 240 may form the upper boundary of internal chamber 236. The lower surface of upper portion 240 may be connected to the lower portion 238. For example, lower surface of upper portion 240 may be ultra-sonic bonded, diffusion bonded, welded, brazed, or the like, to the lower portion 238. When the lower surface of upper portion 240 is connected to the lower portion 238, internal chamber 236 is formed by the prenoted boundaries. Upper portion 240 may further include inlet 241. Inlet 241 includes walls and an internal conduit open to the internal chamber 236. Inlet cover 242 may effectively seal the internal conduit. Inlet 241 allows for liquid metal 244 to be inserted, injected, or the like into internal chamber 236. Liquid metal 244 may fully fill internal chamber 236. Liquid metal 244 may further partially fill the internal conduit. In some implementations, the liquid metal 244 may be pressurized within internal chamber 236. For example, a noble gas may be forced into the internal conduit thereby pressurizing liquid metal 244. In such embodiments, residual noble gas 246 may exist between the upper surface of liquid metal 244 and the lower surface of inlet cap 242.

In these embodiments, pressurized liquid metal 244 may more efficiently transfer heat away from IC device 202 thereby further improving the removal of heat from IC device 202.

Liquid metal 244 takes the shape of vessel in which it is contained. Therefore, when deformable floor 237 deforms the shape of the liquid metal 244 changes to accommodate the deformation of the deformable floor 237. In such instances, the liquid metal 244 maintains contact with the lower surface 235 of internal chamber 236. Liquid metal 244 may be for example, a Ga—Sn binary eutectic alloy, a Ga—In binary eutectic alloy, a Ga—In—Sn ternary eutectic alloy, Ga metal, or the like.

In some implementations, the sidewalls of lower portion 238 and upper portion 240 may be coplanar.

Figure 5:
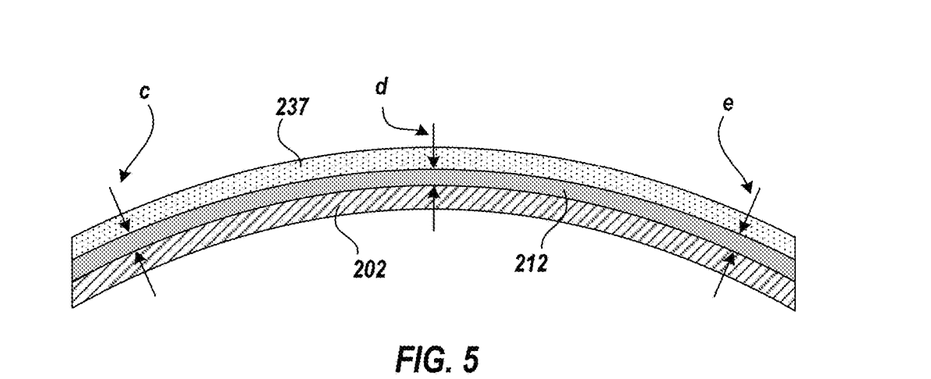
FIG. 5 depicts cross section view of a conformal lid achieving a uniform TIM BLT when an IC device exhibits warpage, according to one or more embodiments of the present invention.

FIG. 5 depicts a cross section view of conformal lid 216 achieving a uniform TIM 212 BLT when IC device 202 exhibits warpage, according to one or more embodiments of the present invention. The thickness of deformable floor 237 is sufficiently thin such that deformable floor 237 deforms or bends when subjected to forces applied thereto by TIM 212 and/or IC device 202 when IC device 202 warps or exhibits non-flat surface abnormalities. In this manner, the deformable floor 237 conforms to the warpage or non-flat surfaces of IC device 202 when such abnormalities occur and the BLT of TIM 212 is uniform across the IC device from the perimeter edges to the center of IC device 202 such that any thickness dimension "c," "d," "e" or the like of TIM 212 are the same plus or minus 20%, or preferably 10%. As the BLT of TIM 212 may achieve a uniform BLT even when IC device 202 exhibits warpage or other non-flat surface abnormalities, the BLT of TIM 212 may be reduced relative to the BLT thickness of TIM 112 at the device periphery. In other words, the amount of TIM 212 may be reduced relative to the amount of TIM 112 at the device periphery, to achieve a lower BLT of TIM 212 which increases the efficiency of heat transfer away from IC device 202.

Further, the pressurized chamber 236 may result in a constant pressure being exerted upon the deformable floor 237 and upon TIM 212, thereby further achieving a substantially uniform BLT of TIM 212. This pressure associated with the pressurized chamber 236 may also reduce TIM 212 shearing stresses due to temperature cycling.

Figure 6:
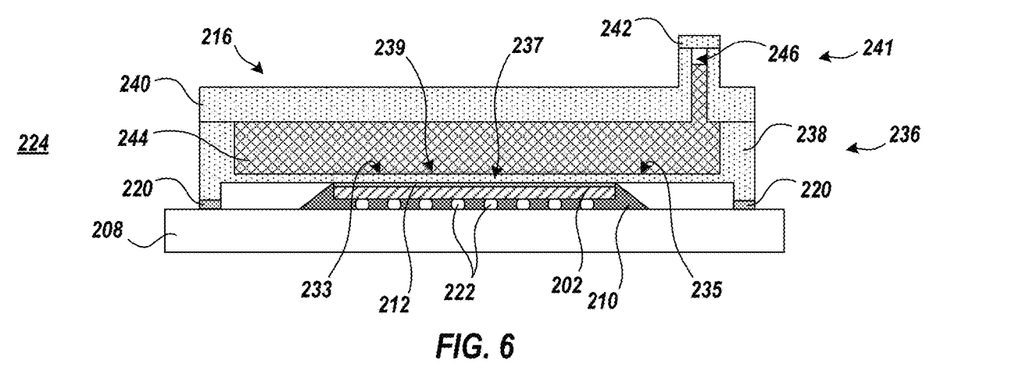
FIG. 6 depicts a cross section view of an IC device package that includes a conformal lid, according to one or more embodiments of the present invention.

FIG. 6 depicts a cross section view of IC device package 224 that includes a conformal lid 216, according to one or more embodiments of the present invention. FIG. 6 may also depict a fabrication stage of IC device package 224 where the conformal lid 216 is connected, joined, or otherwise attached to IC device 202 and/or attached to carrier 208. At such fabrication stage, deformable floor 237 maintains planarity, or does not deform. For example, the forces associated with joining the conformal lid 216 to IC device 202 are less than would be required to deform deformable floor 237.

Figure 7:
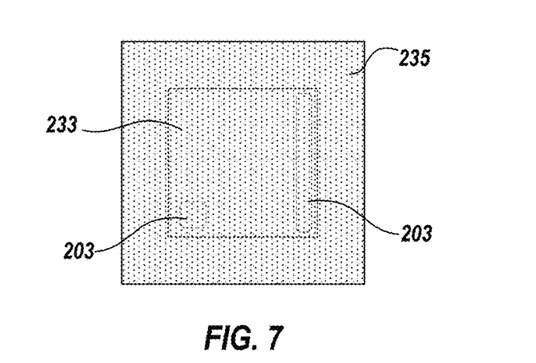
FIG. 7 depicts a normal view of a lower surface of an internal chamber of the conformal lid, according to one or more embodiments of the present invention.

FIG. 7 depicts a normal view of lower surface 235 of internal chamber 236, according to one or more embodiments of the present invention. Lower surface 235 includes an IC device region 233. IC device region 233 may be the perimeter, sidewall, or circumferential footprint of IC device 202 projected onto lower surface 235. Lower surface 235 may further include hotspot region(s) 203. Hotspot region 203 may be the perimeter, sidewall, or circumferential footprint of a predetermined hotspot area of IC device 202 projected onto lower surface 235. The predetermined hotspot area of IC device 202 may be an area of IC device 202 which is projected to experience or does experience relatively higher temperatures relative to other areas of IC device 202. For example, IC device 202 hotspot(s) may be located at the corner(s) of IC device 202, may be located in area(s) of IC device 202 with a relatively high concentration of power planes, may be located in area(s) of IC device with a relatively high concentration of input/output (I/O) electrical pathways, or the like.

Figure 8:
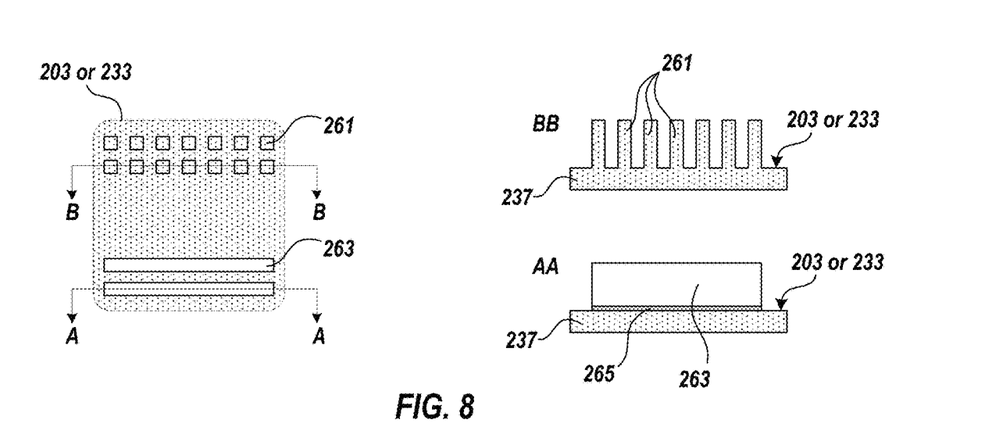
FIG. 8 depicts various views of a lower surface of an internal chamber of the conformal lid, according to one or more embodiments of the present invention.

FIG. 8 depicts various views of IC device region 233 and/or hotspot region 203 of lower surface 235, according to one or more embodiments of the present invention. In order to preferentially stiffen the deformable floor in certain desired locations, stiffening pins 261, fins 263, or the like may be included in hotspot region(s) 203. The pins 261 and/or fins extend from lower surface 235 upward into internal chamber 236. These stiffening elements may locally provide enhanced heat transfer over the hotspot regions 203. The pins 261 and/or fins 263 may be formed from a metal, such as copper, aluminum, silver, or the like. The pins 261 and/or fins 263 may be machined into lower portion 238 such that the pins 261 and/or fins 263 and the deformable floor 237 are integrated features. Alternatively, the pins 261 and/or fins 263 may be distinct from the deformable floor 237. In such implementations, the pins 261 and/or fins 263 are joined to lower surface 235 by e.g., welding, ultra-sonic welding, sintering, bonding, brazing, or the like.

In one embodiment, the pins 261 and/or fins 263 are located within IC device region 233 such that the vast majority (i.e. greater than 80%) of the IC device region 233 is associated with the pins 261 and/or fins 263. In another embodiment, the pins 261 and/or fins 263 are not located in the general IC device region 233 but are specifically located within one or more hotspot regions 203 such that the vast majority of the hotspot region(s) 203 in which the pins 261 and/or fins 263 are located are associated with the pins 261 and/or fins 263.

The pins 261 and/or fins 263 may effectively stiffen deformable floor 237 in regions in which they are present, thereby lessing the ability of deformable floor 237 to bend or deform. Though in embodiments pins 261 and/or fins 263 may effectively stiffen deformable floor 237, deformable floor 237 maintains the ability to bend along with IC device 202 when IC device 202 warps. Because pins 261 and/or fins 263 may effectively stiffen deformable floor 237, in embodiments, the number of and/or locations of pins 261 and/or fins 263 may be minimized. For example, pins 261 may be located in a single hotspot region 203 which is predetermined to correspond to the projected highest temperature region within IC device 202.

Figure 9:
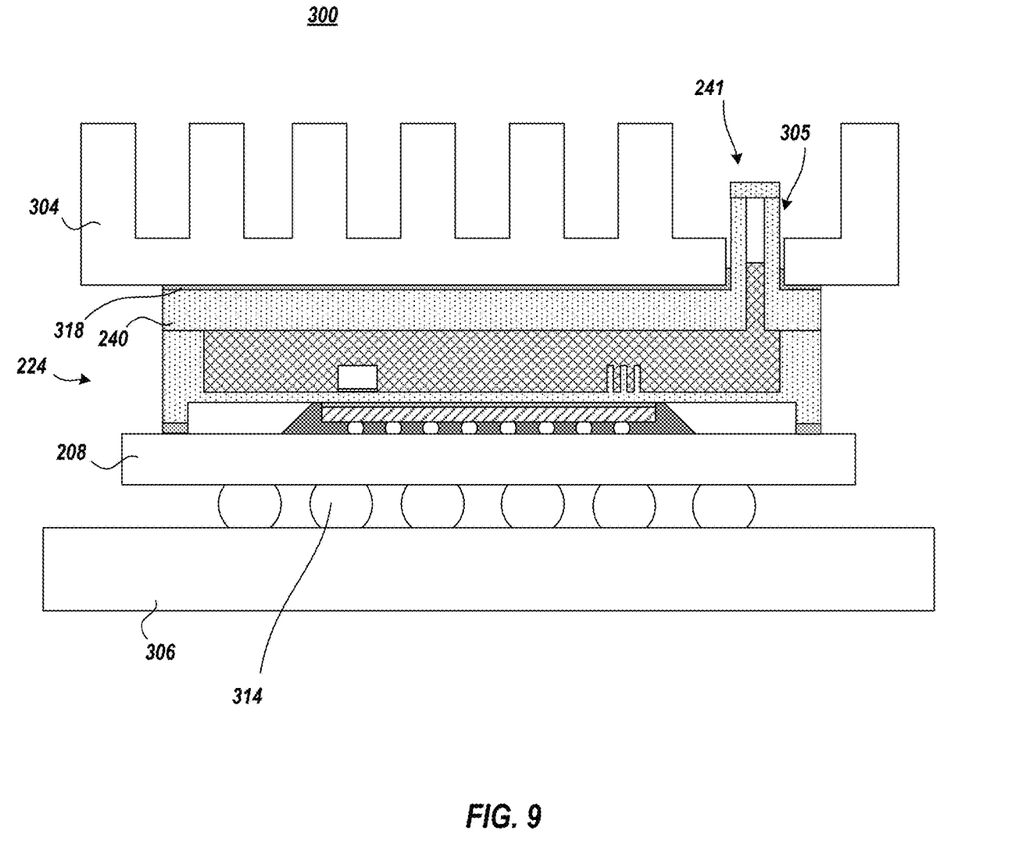
FIG. 9 depicts a cross section view of an electronic system, according to one or more embodiments of the present invention.

FIG. 9 depicts a cross section view of an electronic system 300, according to one or more embodiments of the present invention. Electronic system 300 may be for example a computer, server, kiosk, tablet, mobile device, or the like. System 300 includes IC chip package 224.

Package 224 may be connected to a motherboard 306 via interconnects 314. Motherboard 306 may be the main or largest printed circuit board of electronic device 300 and may include electronic components, such as a graphics processing unit, memory, hard drive storage, or the like, and may further provide connectors for other peripherals. Interconnects 314 electrically connect the lower side of carrier 208 to motherboard 306 and may be a wire bond, solder bond, stud, conductive ball, conductive button, land grid array (LGA) of compliant pins, and the like. Interconnects 314 may be larger and thus more robust than interconnects 222. When package 224 is seated upon motherboard 306 a second reflow process may be performed to join interconnects 314 to electrical contacts of both carrier 208 and motherboard 306. Alternately, a mechanical pressurized interconnect via an intervening socket may be utilized.

To assist in the removal of heat from IC device 202 a heatsink 304 may be thermally joined to package 224 via thermal interface material 318. Heatsink 304 may be a passive heat exchanger that cools IC device 202 by dissipating heat into the surrounding air. Heatsink 304 may alternatively be part of an active heat exchanging system that cools IC device 202 by dissipating heat into an actively cooled fluid.

During operation of electronic device 300, a thermal path may exist from IC device 202 through conformal lid 216 and into heatsink 304. A thermal interface material (TIM) 318 may join or connect the heatsink 304 and the top surface of upper portion 240 of conformal lid 216.

Heatsink 304 may include a clearance hole 305 through which the inlet 241 may protrude. In embodiments, due to the inlet being accessible through the clearance hole 305, the liquid metal 244 may be injected into chamber 236 prior to or after the heatsink 304 is connected to the top surface of upper portion 240 of conformal lid 216. In some instances, during the joining of heatsink 304 to conformal lid 216, TIM 318 may be forced into clearance hole 305 and may connect the sidewall(s) of inlet 241 and heatsink 304, thereby increasing heat transfer from conformal lid 216 into heatsink 304.

Figure 10:
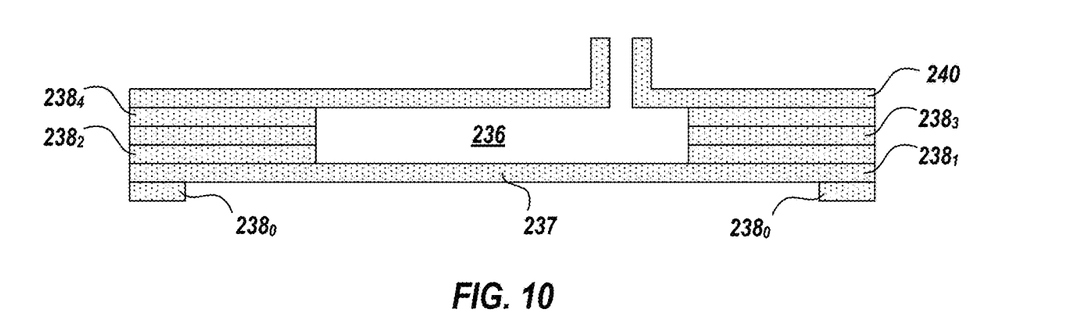
FIG. 10 depicts a cross section view of an a conformal lid fabricated according to one or more embodiments of the present invention.

FIG. 10 depicts a cross section view of conformal lid 216 fabricated by a layer build up technique, according to an embodiment of the present invention. In the present embodiment, conformal lid 216 may be fabricated by bonding (e.g., diffusion bonding, or the like) layers of metal or other thermally conductive material to form lower portion 238. For example, the pedestal of conformal lid 216 may be formed by bonding a layer $238_0$ around the perimeter of the lower surface of a first layer portion $238_1$. Layers $238_2$, $238_3$, $238_4$, $238_n$, may be successively bonded around the perimeter of a lower surface. Finally, the upper portion 240 may be bonded to the underlying layer $238_4$, $238_n$, such that the internal chamber 236 is formed between the upper portion 240 and lower portion $238_1$ and internal to the perimeter buildup of layers $238_2$, $238_3$, $238_4$, $238_n$. In an implementation, layer $238_1$ forms the deformable floor 237 and may be the same or different thickness relative to the other layers $238_0$, $238_2$, $238_3$, $238_4$, $238_n$.

Figure 11:
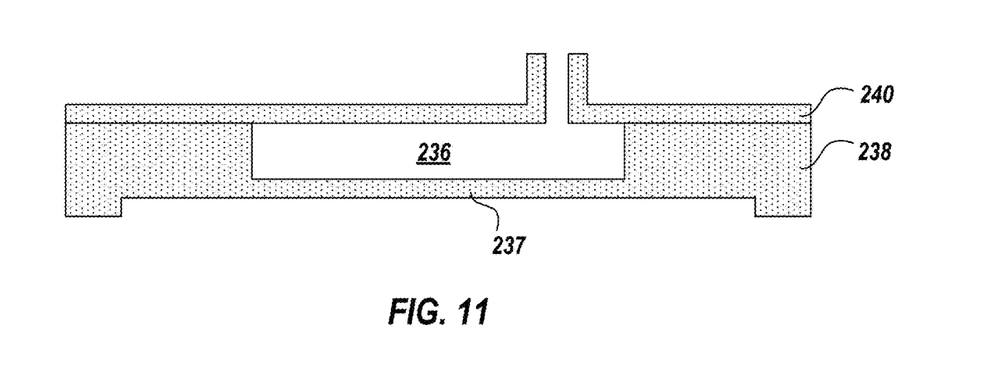
FIG. 11 depicts a cross section view of an a conformal lid fabricated according to one or more embodiments of the present invention.

FIG. 11 depicts a cross section view of a conformal lid 216 fabricated according to one or more embodiments of the present invention. In the present embodiment, lower portion 238 is formed by machining a metal block such that the previously described features of lower portion 238 are formed from the same metal block. The upper portion 240 may be bonded to the lower portion 238 such that the internal chamber 236 is formed between the upper portion 240 and lower portion 238.

Figure 12:
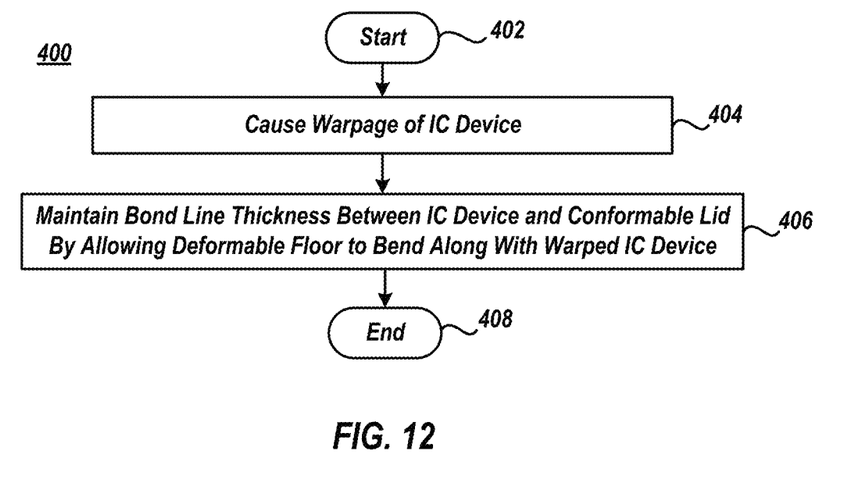
FIG. 12 depicts a method of a conformal lid achieving a uniform TIM BLT, according to one or more embodiments of the present invention.

FIG. 12 depicts a method 400 of conformal lid 216 achieving a uniform TIM 212 BLT, according to one or more embodiments of the present invention. Method 400 begins at block 402 and continues for causing warpage of IC device 202 (block 404). For example, during operation of electronic device 300, due to differences in CTE of various components therein and/or due to thermal cycling (cycles of operation or heat generating and nonoperation or non-heat generating) thereof, IC device 202 may deform.

Method 400 may continue with achieving a uniform BLT of TIM 212 between IC device 202 and conformal lid 216 by allowing deformable floor 237 to bend around the warped IC device 202. The term "allowing," or the like when utilized in the present context is defined herein as to be configured to give the necessary opportunity for. For example, electronic device 300 may utilize IC device 202 that may warp or otherwise be susceptible to surface irregularities. To achieve a uniform BLT of TIM 212, electronic device 300 may utilize conformal lid 216 which is configured to allow for the deformable floor 237 to bend around such types of IC devices 202. In this manner, electronic device 300 in its utilization of conformal lid 216 gives the necessary opportunity for the deformable floor 237 of conformal lid 216 to bend around IC devices 202 that when such devices warp, etc. In instances, the deformable floor 237 bends around the deformed IC device 202 such that the BLT of TIM 212 is substantially constant across the IC device 202 from the perimeter edges to its center. Method 400 may end at block 408.

Figure 13:
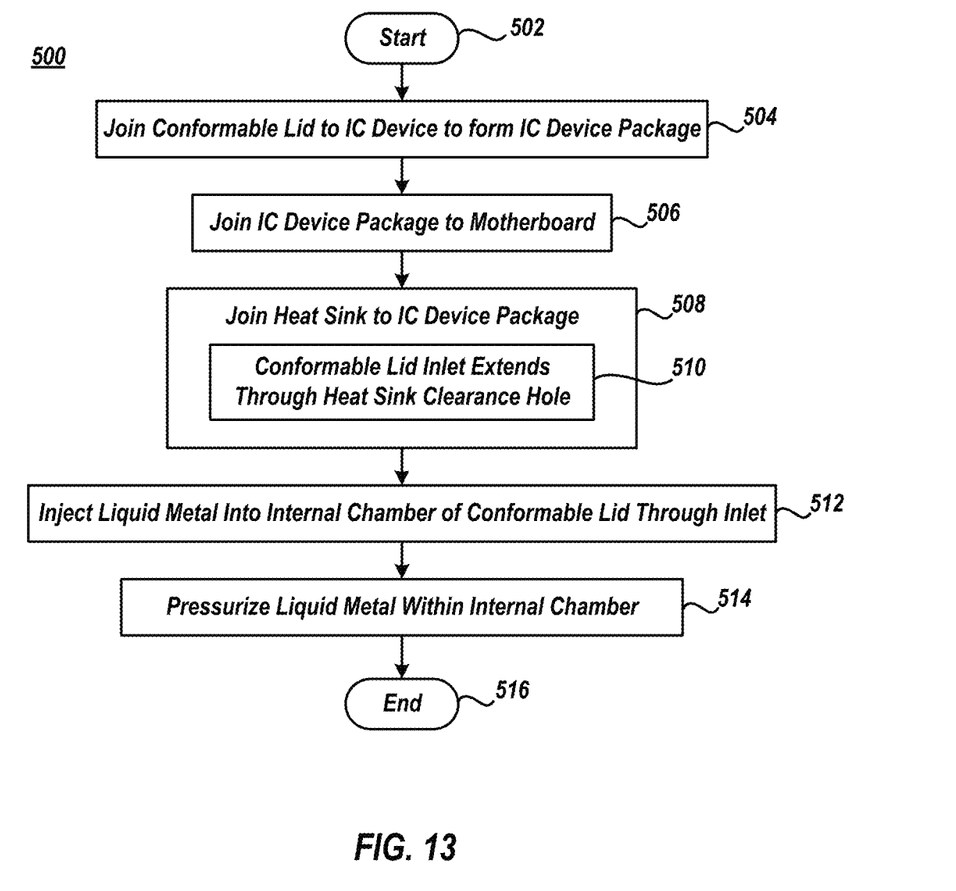
FIG. 13 depicts a method of fabricating an electronic system, according to one or more embodiments of the present invention.

FIG. 13 depicts a method 500 of fabricating electronic system 300, according to one or more embodiments of the present invention. Method 500 begins at block 502 and may continue with joining conformable lid 216 to IC device 202, thereby forming IC device package 224. For example, TIM 212 joins the lower surface of deformable floor 237 and the upper surface of IC device 202. In some implementations the conformable lid 216 may further be joined to carrier 208. For example, seal band adhesive 220 may be applied to the carrier 208 around the perimeter of the IC device 202 site. The conformable lid 216 may be joined to the seal band adhesive 220 which may be subsequently cured.

Method 500 may continue with joining the IC device package 224 with motherboard 306 (block 506). For example, IC device package 224 may be joined to motherboard 306 with contacts 314 such that a contact 314 joins a pad of carrier 308 with a pad of motherboard 306.

Method 500 may continue with joining heatsink 308 with conformable lid 216 (block 508). For example, TIM 318 may be applied to the upper surface of conformable lid 216 in a predetermined pattern. Heatsink 308 may be forced upon the conformable lid 216 spreading or thinning TIM 318. Heatsink 308 may be positioned relative to conformable lid 216 such that the inlet 241 of conformable lid 216 extends through, penetrates, etc. the clearance hole 305 within the heatsink 304. TIM 318 may be forced into clearance hole 305 and may connect the sidewall(s) of inlet 241 with heatsink 304.

Method 500 may continue with subsequently injecting liquid metal 244 into internal chamber 236 of conformable lid 216 through inlet 241 (block 512) and pressurizing the liquid metal 244 within the internal chamber 236 (block 514). By filling and pressurizing internal chamber 236 with liquid metal 244 subsequent to the joining of heatsink 304 to conformable lid 216, a more accurate pressure and force from deformable floor 237 to IC device 202 may be achieved resulting in a relatively thinner and consistent BLT of TIM 212. Method 500 may end at block 516.

Figure 14:
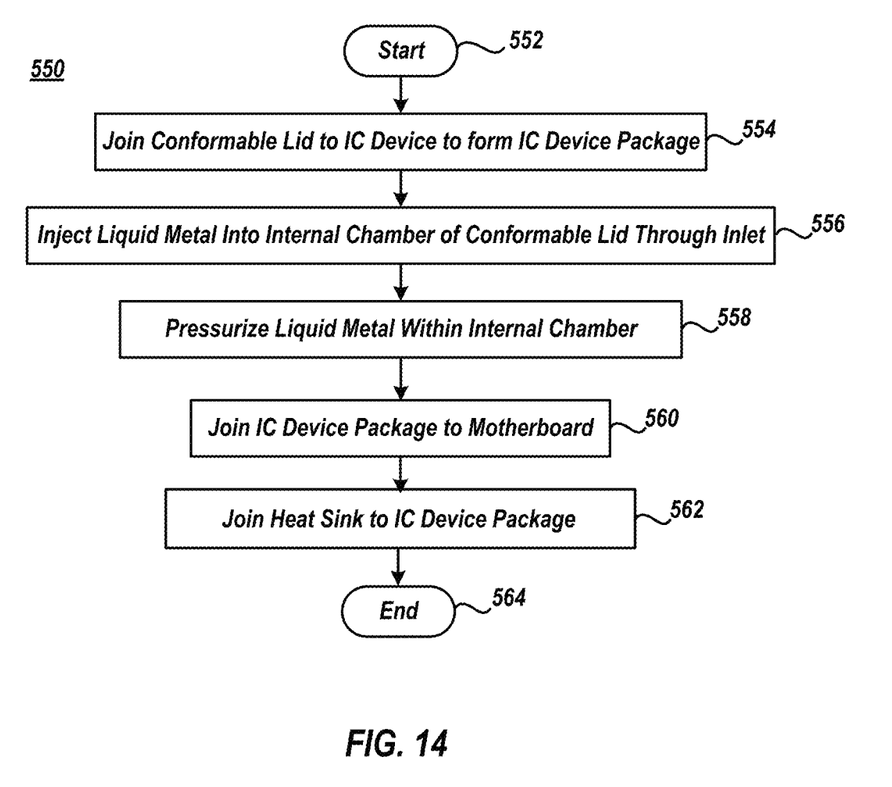
FIG. 14 depicts a method of fabricating an electronic system, according to one or more embodiments of the present invention.

FIG. 14 depicts a method 550 of fabricating electronic system 300, according to one or more embodiments of the present invention. Method 550 begins at block 552 and may continue with joining conformable lid 216 to IC device 202, thereby forming IC device package 224. For example, TIM 212 joins the lower surface of deformable floor 237 and the upper surface of IC device 202. In some implementations the conformable lid 216 may further be joined to carrier 208. For example, seal band adhesive 220 may be applied to the carrier 208 around the perimeter of the IC device 202 site. The conformable lid 216 may be joined to the seal band adhesive 220 which may be subsequently cured.

Method 550 may continue with subsequently injecting liquid metal 244 into internal chamber 236 of conformable lid 216 through inlet 241 (block 556) and pressurizing the liquid metal 244 within the internal chamber 236 (block 558).

Method 550 may continue with joining the IC device package 224 with motherboard 306 (block 560). For example, IC device package 224 may be joined to motherboard 306 with contacts 314 such that a contact 314 joins a pad of carrier 308 with a pad of motherboard 306.

Method 550 may continue with joining heatsink 308 with conformable lid 216 (block 562). For example, TIM 318 may be applied to the upper surface of conformable lid 216 in a predetermined pattern. Heatsink 308 may be forced upon the conformable lid 216 spreading or thinning TIM 318. Heatsink 308 may be positioned relative to conformable lid 216 such that the inlet 241 of conformable lid 216 extends through, penetrates, etc. the clearance hole 305 within the heatsink 304. TIM 318 may be forced into clearance hole 305 and may connect the sidewall(s) of inlet 241 with heatsink 304. Method 550 may end at block 564.

The accompanying figures and this description depicted and described embodiments of the present invention, and features and components thereof. Those skilled in the art will appreciate that any particular program nomenclature used in this description was merely for convenience, and thus the invention should not be limited to use solely in any specific application identified and/or implied by such nomenclature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. For example, the order of the fabrication stages listed in depicted blocks may occur out of turn relative to the order indicated in the Figures, may be repeated, and/or may be omitted partially or entirely. The terminology used herein was chosen to best explain the principles of the embodiment, the practical application or technical improvement over technologies found in the marketplace, or to enable others of ordinary skill in the art to understand the embodiments disclosed herein.

References herein to terms such as "vertical", "horizontal", and the like, are made by way of example, and not by way of limitation, to establish a frame of reference. The term "horizontal" as used herein is defined as a plane parallel to the conventional plane or surface of the carrier 208, regardless of the actual spatial orientation of the carrier 208. The term "vertical" refers to a direction perpendicular to the horizontal, as just defined. Terms, such as "on", "above", "below", "side" (as in "sidewall"), "higher", "lower", "over", "top", "under", "beneath", and the like, are defined with respect to the horizontal plane. It is understood that various other frames of reference may be employed for describing the present invention without departing from the spirit and scope of the present invention.

What is claimed is:

1. An electronic device comprising:
   an IC device carrier;
   an IC device connected to the upper surface of the IC device carrier, the IC device comprising a convex upper surface;
   a conformable lid comprising an internal chamber, an internal chamber inlet, and a deformable floor, the deformable floor comprising a concave lower surface;

a thermal interface material (TIM) that connects the convex upper surface and the concave lower surface, the TIM comprising a uniform bond line thickness; and a heatsink connected to an upper surface of the conformable lid, wherein the internal chamber inlet extends through a base of the heatsink.

2. The electronic device of claim 1, further comprising: liquid metal within the internal chamber.

3. The electronic device of claim 1, further comprising: a plurality of pins that each extend from a lower surface of the internal chamber.

4. The electronic device of claim 1, further comprising: one or more fins that extend from a lower surface of the internal chamber.

5. The electronic device of claim 2, wherein the liquid metal is pressurized and wherein the internal chamber further comprises residual gas utilized to pressurize the liquid metal.

6. The electronic device of claim 1, wherein conformable lid further comprises a lower portion and an upper portion.

7. The electronic device of claim 6, wherein the lower portion comprises a plurality of stacked metal layers, wherein an upper surface of a first metal layer is diffusion bonded to a bottom surface of a second metal layer.

8. The electronic device of claim 3, wherein the plurality of pins are located solely within a predetermined hotspot region of the lower surface of the internal chamber.

9. A method of achieving a uniform bond line thickness of a thermal interface material (TIM) between an integrated circuit (IC) device and a conformable lid that comprises a deformable floor, an internal chamber, and one or more stiffening elements extending from the deformable floor into the internal chamber, the method comprising:

allowing the deformable floor of the conformable lid to bend around a warped IC device, wherein the bent deformable floor comprises a concave lower surface, and wherein the TIM connects a convex upper surface of the warped IC device and the concave lower surface and comprises the uniform bond line thickness.

10. The method of claim 9, wherein the internal chamber comprises liquid metal there within.

11. The method of claim 10, wherein the one or more stiffening elements comprise a plurality of pins, wherein each of the plurality of pins extend from a lower surface of the internal chamber and is in conduction contact with the liquid metal.

12. The method of claim 10, wherein the one or more stiffening elements comprises a plurality of fins, wherein each of the plurality of fins extend from a lower surface of the internal chamber and is in conduction contact with the liquid metal.

13. The method of claim 10, wherein the liquid metal is pressurized and wherein the internal chamber further comprises residual gas utilized to pressurize the liquid metal.

14. The method of claim 9, wherein conformable lid further comprises a lower portion and an upper portion.

15. The method of claim 9, wherein the lower portion comprises a plurality of stacked metal layers, wherein an upper surface of a first metal layer is diffusion bonded to a bottom surface of a second metal layer.

16. The method of claim 11, wherein the plurality of pins are located solely within a predetermined hotspot region of the lower surface of the internal chamber.

17. An electronic device fabrication method comprising:

connecting an integrated circuit (IC) device package to a motherboard;

connecting a heatsink to the upper surface of a conformable lid of the IC device package, wherein an inlet to an internal chamber of the conformable lid extends through a clearance hole within the heatsink; and subsequent to connecting the heatsink to the upper surface of the conformable lid, injecting liquid metal into the internal chamber through the inlet.

18. The method of claim 17, further comprising: pressurizing the liquid metal within the internal chamber.

19. The method of claim 17, wherein a thermal interface material connects the heatsink to the upper surface of the conformable lid and connects a sidewall of the inlet to the heatsink.

* * * * *